United States Patent [19]

Hirano et al.

[11] Patent Number: 5,648,686

[45] Date of Patent: Jul. 15, 1997

[54] CONNECTING ELECTRODE PORTION IN SEMICONDUCTOR DEVICE

[75] Inventors: Naohiko Hirano; Kazuhide Doi; Masayuki Miura; Takashi Okada, all of Kawasaki; Yoichi Hiruta, Kashiwa, all of Japan

[73] Assignee: Kabushiki Kaisha Toshiba, Kawasaki, Japan

[21] Appl. No.: 506,930

[22] Filed: Jul. 26, 1995

[30] Foreign Application Priority Data

Jul. 27, 1994 [JP] Japan .................. 6-175448

[51] Int. Cl.⁶ .................................................. H01L 23/48
[52] U.S. Cl. .......................... 257/778; 257/737; 257/767; 257/780; 257/781; 257/915
[58] Field of Search .......................... 257/737, 767, 257/915, 778, 780.1

[56] References Cited

FOREIGN PATENT DOCUMENTS 63-49377  10/1988  Japan .
04018760   1/1992  Japan .................. 257/767

*Primary Examiner*—Mahshid D. Saadat
*Assistant Examiner*—T. M. Arroyo
*Attorney, Agent, or Firm*—Finnegan, Henderson, Farabow, Garrett & Dunner, L.L.P.

[57] ABSTRACT

An Al layer which serves as a lead-out electrode is formed on a semiconductor chip. An insulating layer is formed on the semiconductor chip and the Al layer. The insulating layer has an opening formed in that portion thereof which is located on the Al layer, thereby exposing a portion of the Al layer. A multi-level metal layer (barrier metal layer) is formed on the exposed portion of the Al layer and on that portion of the insulating layer which is located along the edge of the opening. A metallic nitride region is provided between a first-level metal layer in the multi-level metal layer and the insulating layer so as to be selectively formed at or under a peripheral portion of the first-level metal layer. A bump electrode is provided on the multi-level metal layer. The resultant semiconductor device is mounted on a circuit board by flip chip bonding, with the bump electrode interposed therebetween.

22 Claims, 2 Drawing Sheets

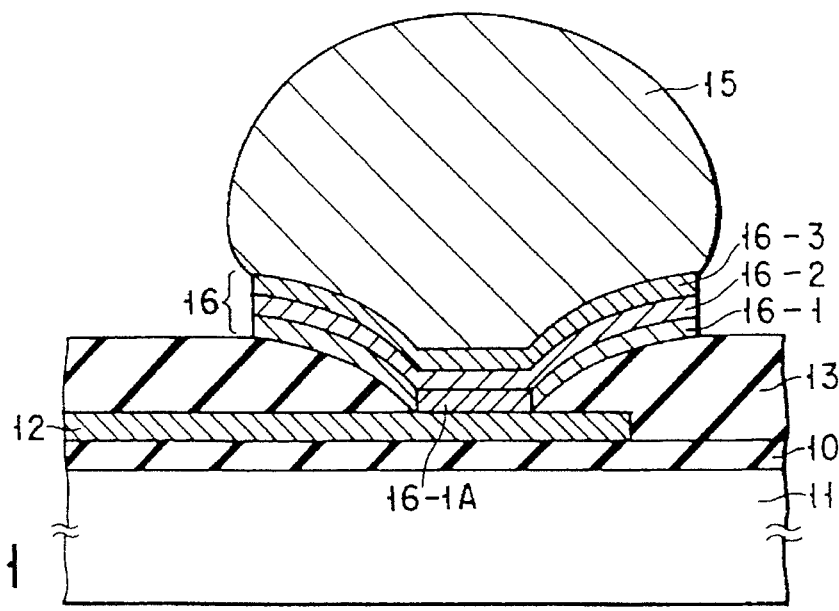
F I G. 1
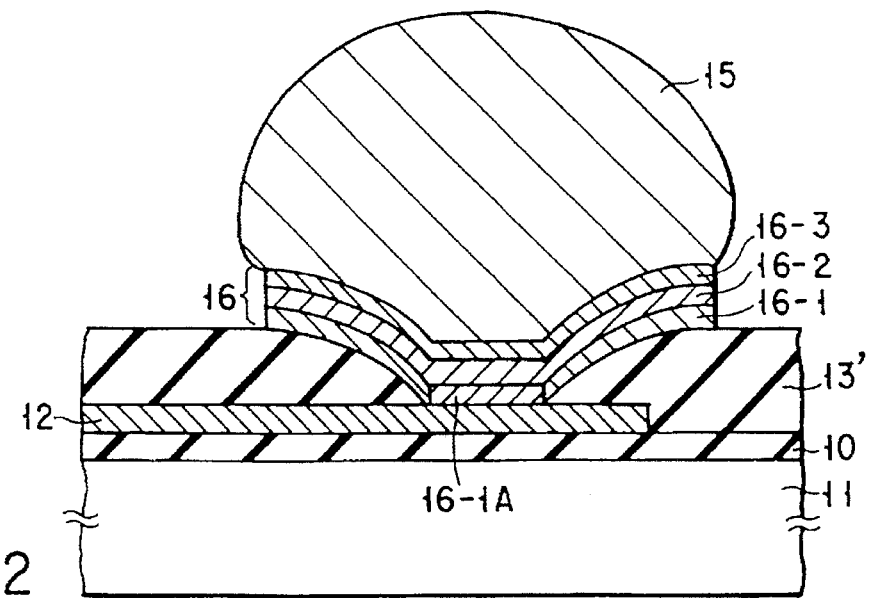
F I G. 2

CONNECTING ELECTRODE PORTION IN SEMICONDUCTOR DEVICE

BACKGROUND OF THE INVENTION

1. Field of the Invention

This invention relates to a semiconductor device to be mounted on a circuit board by flip chip bonding with that bump electrode interposed therebetween, which is made of a low-melting-point metal, and more particularly to a connecting electrode portion employed in the semiconductor device.

2. Description of the Related Art

In a semiconductor device of this type, a multi-level metal layer, called a "BLM (Ball Limited Metal) layer" or a "barrier metal layer", is formed at a connecting electrode portion, and a bump electrode made of a low-melting-point metal such as solder is formed on the metal layer. A laminated structure consisting of two or three metal layers is known as a structure of the "barrier metal layer". In the case of the three-layer structure, a first-level metal layer is provided for enhancing the adhesion of the structure to an Al layer which is formed on a semiconductor chip to lead out an electrode. A second-level metal layer is provided for preventing diffusion of solder into the Al layer. A third-level metal layer is provided for protecting oxidation of the second-level metal layer.

As regards the materials of the barrier metal layer, Japanese Patent Application KOKOKU Publication No. 63-49377, for example, discloses a Ti metal layer as the first-level layer, an Ni metal layer as the second-level layer, and an $SiO_2$ layer as an insulating layer between the Al layer and the multi-level metal layer.

In the general process for forming the above-described connecting electrode portion, the first-level metal layer or the first- through third-level metal layers are formed on the overall surface of an insulating layer which is formed on the Al layer and has an opening, and the resultant structure is patterned to desired shape and size. Thereafter, the bump electrode is formed on the barrier metal layer by electrolytic plating, etc.

The thus-formed connecting electrode portion, however, has various disadvantages as follows:

(1) Since the first-level metal layer is excessively oxidized in an etching process for patterning, the reliability of the connecting electrode portion is reduced.

(2) In the case of using a Ti layer with oxygen dispersed therein as the first-level metal layer, an insulating layer made of a material other than $SiO_2$ cannot have a sufficient adhesion to the first-level metal layer, and hence the use of such an insulating layer will cause a reduction in the reliability of the barrier metal layer after long use.

(3) Although transition metals having high reactivity are generally used to form the first-level layer, their oxides are unstable and therefore reduce the reliability of the layer after connection.

(4) Since an oxide in the first-level metal layer is an electrical insulator, the layer will show a high electrical resistance if it contains a great amount of oxygen.

SUMMARY OF THE INVENTION

It is the object of the invention to provide a semiconductor device equipped with a connecting electrode portion which has excellent connecting properties and high reliability maintained through long use.

The object is attained by a semiconductor device comprising a semiconductor chip; an Al layer formed on the semiconductor chip and serving as a lead-out electrode; an insulating layer formed on the semiconductor chip and the Al layer and having an opening formed in that portion thereof which is located on the Al layer, thereby exposing a portion of the Al layer; a multi-level metal layer formed on the exposed portion of the Al layer and on that portion of the insulating layer which is located along the edge of the opening; and a metallic nitride region located between a first-level metal layer in the multi-level metal layer and the insulating layer so as to be selectively formed at or under a peripheral portion of the first-level metal layer.

Since in the above-described structure, a metallic nitride region which does not easily react with oxygen is formed at least in part of the first-level metal layer of the multi-level metal layer, the first-level metal layer is hard to oxidize in an etching process for patterning the same, and can have excellent connecting properties.

In the case of using a Ti layer with oxygen dispersed therein as the first-level metal layer, even an insulating layer made of a material other than $SiO_2$ can have a sufficient adhesion to the first-level metal layer by virtue of the metallic nitride region, and hence can maintain the reliability through long use. Further, even if a transition metal having high reactivity is used as the material of the first-level metal layer, the metallic nitride region is hard to oxidize, and therefore the reliability of the layer can be maintained after connection and an increase in electrical resistance can be prevented.

The object of the invention is also attained by a semiconductor device comprising a semiconductor chip; an Al layer formed on the semiconductor chip and serving as a lead-out electrode; an insulating layer formed on the semiconductor chip and the Al layer and having an opening formed in that portion thereof which is located on the Al layer, thereby exposing a portion of the Al layer; a multi-level metal layer formed on the exposed portion of the Al layer and on that portion of the insulating layer which is located along the edge of the opening; and a metallic nitride region located between a first-level metal layer in the multi-level metal layer and the insulating layer so as to be selectively formed at or under a peripheral portion of the first-level metal layer.

Since in the above-described structure, a metallic nitride layer which does not easily react with oxygen is located between a first-level metal layer in the multi-level metal layer and the insulating layer so as to be selectively formed only at or under a peripheral portion of the first-level metal layer, the first-level metal layer is hard to oxidize in an etching process for patterning the same, and can have excellent connecting properties. In the case of using a Ti layer with oxygen dispersed therein as the first-level metal layer, even an insulating layer made of a material other than $SiO_2$ can have a sufficient adhesion to the first-level metal layer by virtue of the metallic nitride region, and hence can maintain the reliability through long use. Further, even if a transition metal having high reactivity is used as the material of the first-level metal layer, the metallic nitride region is hard to oxidize, and therefore the reliability of the layer can be maintained after connection and an increase in electrical resistance can be prevented.

Furthermore, the object of the invention is attained by a semiconductor device comprising a semiconductor chip; an Al layer formed on the semiconductor chip and serving as a lead-out electrode; an insulating layer formed on the semiconductor chip and the Al layer and having an opening formed in that portion thereof which is located on the Al layer, thereby exposing a portion of the Al layer; a multi-level metal layer consisting of a first-level layer and a second-level layer, and formed on the exposed portion of the Al layer and on that portion of the insulating layer which is located along the edge of the opening; a first metallic nitride layer located between a first-level metal layer in the multi-level metal layer and the insulating layer so as to be selectively formed at or under a peripheral portion of the first-level metal layer; and a second metallic nitride layer formed at least partially between the first-level metal layer and the second-level metal layer.

In the above structure, a first metallic nitride layer which does not easily react with oxygen is located between a first-level metal layer and the insulating layer so as to be selectively formed under a peripheral portion of the first-level metal layer, and a second metallic nitride layer which does not easily react with oxygen is formed at least partially between the first-level metal layer and the second-level metal layer. Therefore, the reliability of the semiconductor device is further enhanced.

Moreover, the object of the invention is attained by a semiconductor device comprising a semiconductor chip; an Al layer formed on the semiconductor chip and serving as a lead-out electrode; an insulating layer formed on the semiconductor chip and the Al layer and having an opening formed in that portion thereof which is located on the Al layer, thereby exposing a portion of the Al layer; a multi-level metal layer consisting of a first-level layer, a second-level layer and a third-level layer which are laminated in this order, and formed on the exposed portion of the Al layer and on that portion of the insulating layer which is located along the edge of the opening; a first metallic nitride layer formed between the first-level metal layer and the Al layer, and at least partially between the first-level metal layer and the insulating layer; and a second metallic nitride layer formed at least partially between the first-level metal layer and the second-level metal layer.

Since in this structure, first and second metallic nitride layers which do not easily react with oxygen are provided, and a third-level metal layer is provided to prevent oxidation of the second-level metal layer, the reliability of the semiconductor device is more enhanced.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is an enlarged sectional view, useful in explaining a semiconductor device according to a third embodiment of the invention, and showing a connecting electrode portion in the semiconductor device mounted by flip chip bonding;

FIG. 2 is an enlarged sectional view, useful in explaining a semiconductor device according to a fourth embodiment of the invention, and showing a connecting electrode portion in the semiconductor device mounted by flip chip bonding;

DETAILED DESCRIPTION OF THE PREFERRED EMBODIMENTS

Figure 3:
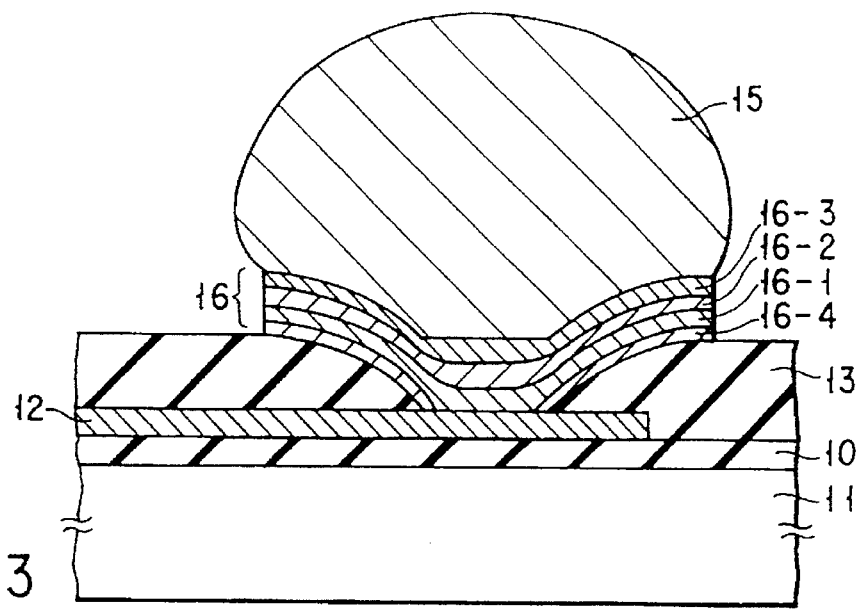
FIG. 3 is an enlarged sectional view, useful in explaining a semiconductor device according to a seventh embodiment of the invention, and showing a connecting electrode portion in the semiconductor device mounted by flip chip bonding.

FIG. 1 shows a connecting electrode portion in a semiconductor device according to a first embodiment of the invention. As is shown in FIG. 1, an insulating layer 10 is formed on a major surface of a semiconductor substrate (semiconductor chip) 11, and an Al layer 12 is formed on the insulating layer 10. The Al layer 12 is electrically connected to a semiconductor element (not shown) formed in the semiconductor chip 11, and serves as a lead-out electrode. An insulating layer 13 made of $SiO_2$ is formed on the resultant structure. An opening is formed in that portion of the insulating film 13 which is located on part of the Al layer 12, and a multi-level metal layer 16 is formed on the exposed portion of the Al layer 12 and the insulating layer 13. A bump electrode 15 made of a low-melting-point metal which is represented by a solder alloy containing Pb and Sn as main components is formed on the metal layer 16.

The multi-level metal layer 16 comprises three metal layers 16-1–16-3. The first-level metal layer 16-1 enhances the adhesion between the metal layer 16 and the Al layer 12. The second-level metal layer 16-2 prevents diffusion of solder into the Al layer 13. The third-level metal layer 16-3 prevents oxidation of the second-level metal layer 16-2. The first-level metal layer 16-1 contains, for example, TiN dispersed therein. The second-level metal layer 16-2 is made, for example, of Ni, and the third-level metal layer 16-3 is made of Pb. In this embodiment, a metallic nitride region of metal layer 16-1 is selectively formed in the peripheral portion; and the first-level metal layer which contacts the insulating layer 13 ($SiO_2$), and that region 16-1A of the first-level metal layer which contacts the Al layer 12 has no nitride region. Thus, the region 16-1A is formed, for example, of Ti, while the regions 16-1 are formed of TiN. The concentration of TiN may be uniform in the overall nitride region 16-1, or may be higher in a portion of the region 16-1 in the vicinity of the insulating layer 13 than in the other portion of the same.

In the FIG. 1 structure, the electric resistance can be kept low. Further, contamination of the first-level metal layer 16-1 with oxygen can be prevented, thereby enabling the reliability of the semiconductor device to be maintained through long use.

The metallic nitride region of the first-level metal layer 16-1, which contains dispersed TiN, protects the layer 16-1 from oxidation at the time of patterning the same, and prevents the increase of the electrical resistance of the layer 16-1 due to contamination of the layer 16-1 with oxygen, thereby maintaining the reliability of the layer through long use.

FIG. 2 shows a connecting electrode portion in a semiconductor device according to a second embodiment of the invention. In this embodiment, SixNy having a high adhesion to a metallic nitride is used as the material of the insulating layer 13' instead of $SiO_2$ used in the first embodiment. Also in this case, the concentration of TiN may be uniform in the overall nitride region 16-1, or may be higher in a portion of the region 16-1 in the vicinity of the insulating layer 13' than in the other portion of the same.

In the FIG. 2 structure, the electric resistance can be kept low, while the first-level metal layer 16-1 can be protected. Further, contamination of the first-level metal layer 16-1 with oxygen can be prevented, thereby enabling the reliability of the semiconductor device to be maintained through long use.

FIG. 3 shows a connecting electrode portion in a semiconductor device according to a third embodiment of the invention. In this embodiment, the nitride layer 16-4, which consists of a lower nitride region of the first-level metal layer 16-1, is provided between the other non-nitride region of layer 16-1 and the insulating layer 13 so as to be selectively formed under a peripheral portion of the other non-nitride region of layer 16-1. SixNy or $SiO_2$ is used as the material of the insulating layer 13.

The device of the third embodiment can prevent contamination of the metal layer 16-1 with oxygen without increasing the electric resistance of the metal layer 16-1, can enhance adhesion between the insulating layer 13 and the metal layer 16-1, and can prevent corrosion of the metal layer 16-1, thereby enhancing the reliability of the layer 16-1.

Figure 4:
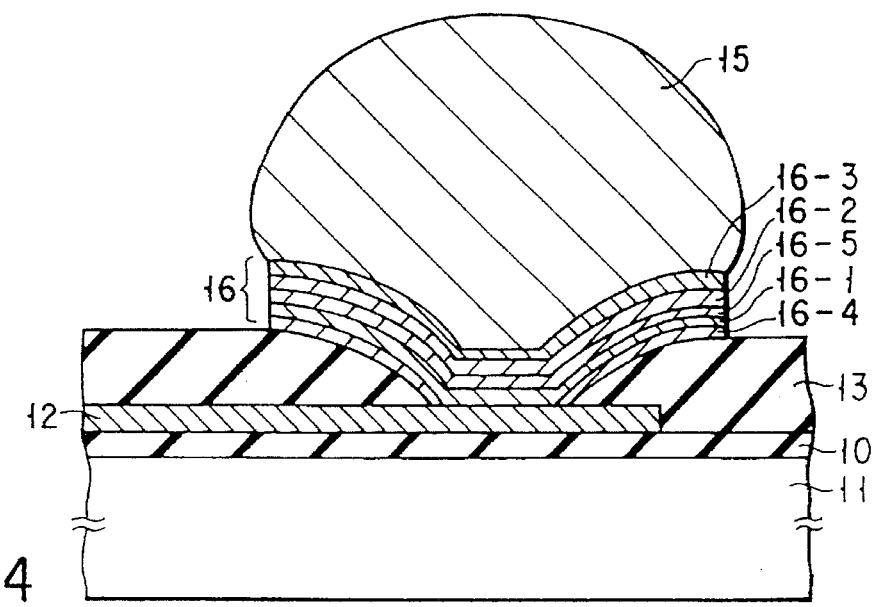
FIG. 4 is an enlarged sectional view, useful in explaining a semiconductor device according to a ninth embodiment of the invention, and showing a connecting electrode portion in the semiconductor device mounted by flip chip bonding.

FIG. 4 shows a connecting electrode portion in a semiconductor device according to a fourth embodiment of the invention. In this embodiment, a metallic nitride layer 16-4 is provided between the metal layer 16-1 and the insulating layer 13, so as to be selectively formed under a peripheral portion of the metal layer 16-1, and a second metallic nitride layer 16-5 is formed between the metal layers 16-1 and 16-2. The first and second metallic nitride layers 16-4 and 16-5 are actually lower and upper nitride regions of the metal layer 16-1, respectively. If an intermediate region, i.e. a non-nitride region, of the metal layer 16-1 is made of Ti, the nitride regions 16-4 and 16-5 are made of TiN. SixNy or $SiO_2$ is used as the material of the insulating layer 13.

The fourth embodiment constructed as above can prevent contamination of the metal layer 16-1 with oxygen without increasing the electric resistance of the metal layer 16-1, can enhance adhesion between the insulating layer 13 and the metal layer 16-1, and can prevent oxidation of the metal layer 16-1 at the time of etching, thereby enhancing the reliability of the metal layer.

Although in the first through fourth embodiments, Ti is used as the material of the first-level metal layer 16-1 of the barrier metal layer 16, the metal layer 16-1 may be made of a IV A-group, VI A-group or II B-group transfer metal in accordance with process conditions or with purpose.

Moreover, although in the embodiments, Ni is used as the material of the second-level metal layer 16-2, the material of the metal layer 16-2 may be selected from VIII A-group, I B-group and II B-group transfer metals in light of process conditions, purpose or properties for preventing diffusion of a metal which constitutes the bump electrode 15.

Although the metal layer 16-3 is made of Pb in the embodiments, it may be made of Au, Pt, Ag or any of their alloys.

Furthermore, in light of purpose, reliability maintained through long use, forming process, etc., the material of the bump electrode 15 is selected from a solder alloy which contains Pb and Sn as main components (e.g. a composition consisting of 95 wt % Pb and 5 wt % Sn; a eutectic composition), a solder alloy which contains Pb and Sn as main components and an additive metal such as Ag, Pd, Sb, Bi, etc., and a low-melting-point metal which does not contain Pb as a main component.

As regards a method for forming a stable metal layer 16-1 or a stable nitride layer which is not contaminated with oxygen, sputtering may be performed in the atmosphere of $N_2$ gas or in an $N_2$ partial pressure of $10^{-4}$–10 Pa, using Ti as a target. It is preferable to set the thickness of the first-level metal layer 16-1 to 500–2000 Å so as to prevent oxidation in the etching process, to secure the conductivity, and to enhance the adhesion to the insulating layer 13. The thicknesses of the second-level metal layer 16-2 and the third-level metal layer 16-3 are set to values falling within a range of 0.1–10 μm, in light of the kind of the bump electrode 15, temperature during use and process conditions. These thicknesses enable high reliability to be secured through long use.

The above-described structure can provide the following advantages:

(a) The metallic nitride region provided between the first-level metal layer and the insulating layer so as to be selectively formed under a peripheral portion of the first-level metal layer can prevent the first-level metal layer from being oxidized in the etching process;

(b) Using TiN as the material of the metallic nitride region and SixNy as that of the insulating layer enhances the adhesion between the Al layer and the bump electrode, since these materials have high adhesions;

(c) The metal nitride which does not easily react with oxygen can prevent oxidation of the first-level metal layer, thereby preventing a reduction in bonding strength; and (d) The metal nitride which does not easily react with oxygen can prevent an increase in electric resistance due to oxidation of the first-level metal layer.

As a result, the invention can provide a semiconductor device of a connecting electrode structure having high reliability through long use and superior connecting properties.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor device to be mounted on a circuit board by flip chip bonding, comprising:

a semiconductor chip;

an Al layer formed on the semiconductor chip and serving as a lead-out electrode;

an insulating layer formed on the semiconductor chip and the Al layer and having an opening formed in that portion thereof which is located on the Al layer, thereby exposing a portion of the Al layer;

a multi-level layer formed on the exposed portion of the Al layer and on that portion of the insulating layer which is located along the edge of the opening; and a metallic nitride layer provided between a first-level metal layer included in the multi-level metal layer and the insulating layer so as to be selectively formed on that portion of the insulating layer which is located along the edge of the opening;

wherein at least a portion of said first-level metal layer is in direct contact with said Al layer.

2. The semiconductor device according to claim 1, wherein the metallic nitride layer extends to the side surfaces of the multi-level metal layer.

3. The semiconductor device according to claim 1, further comprising a bump electrode formed on the multi-level metal layer.

4. The semiconductor device according to claim 3, wherein the bump electrode is made of a low-melting-point metal.

5. The semiconductor device according to claim 4, wherein the low-melting-point metal is one of a solder alloy containing Pb and Sn as main components, and a solder alloy containing Pb and Sn as main components and at least one additive metal selected from the group consisting of Ag, Pd, Sb and Bi.

6. The semiconductor device according to claim 1, wherein the first-level metal layer is made of Ti, the metallic nitride layer is made of TiN, and the insulating layer is made of SixNy.

7. The semiconductor device according to claim 1, wherein the first-level metal layer is made of one selected from the group consisting of IV A-group, VI A-group and II B-group transition metals.

8. A semiconductor device to be mounted on a circuit board by flip chip bonding, comprising:

a semiconductor chip;

an Al layer formed on the semiconductor chip and serving as a lead-out electrode;

an insulating layer formed on the semiconductor chip and the Al layer and having an opening formed in that portion thereof which is located on the Al layer, thereby exposing a portion of the Al layer;

a multi-level layer comprised of a first-level metal layer and a second-level layer, and formed on the exposed portion of the Al layer and on that portion of the insulating layer which is located along the edge of the opening;

a first metallic nitride layer provided between the first-level metal layer and the insulating layer so as to be selectively formed on that portion of the insulating layer which is located along the edge of the opening; and a second metallic nitride layer formed at least partially between the first-level metal layer and the second-level metal layer; wherein at least a portion of said first-level metal layer is in direct contact with said Al layer.

9. The semiconductor device according to claim 8, further comprising a bump electrode formed on the multi-level layer.

10. The semiconductor device according to claim 9, wherein the bump electrode is made of a low-melting-point metal.

11. The semiconductor device according to claim 10, wherein the low-melting-point metal is one of a solder alloy containing Pb and Sn as main components, and a solder alloy containing Pb and Sn as main components and at least one additive metal selected from the group consisting of Ag, Pd, Sb and Bi.

12. The semiconductor device according to claim 8, wherein the first-level metal layer is made of Ti, the metallic nitride region is made of TiN, and the insulating layer is made of SixNy.

13. The semiconductor device according to claim 8, wherein the first-level metal layer is made of one selected from the group consisting of IV A-group, VI A-group and II B-group transition metals.

14. The semiconductor device according to claim 8, wherein the second-level layer is made of one selected from the group consisting of VIII A-group, I B-group and II B-group transition metals.

15. A semiconductor device to be mounted on a circuit board by flip chip bonding, comprising:

a semiconductor chip;

an Al layer formed on the semiconductor chip and serving as a lead-out electrode;

an insulating layer formed on the semiconductor chip and the Al layer and having an opening formed in that portion thereof which is located on the Al layer, thereby exposing a portion of the Al layer;

a multi-level layer comprised of a first-level metal layer, a second-level layer and a third-level layer which are laminated in this order, and formed on the exposed portion of the Al layer and on that portion of the insulating layer which is located along the edge of the opening;

a first metallic nitride layer provided between the first-level metal layer and the insulating layer so as to be selectively formed on that portion of the insulating layer which is located along the edge of the opening; and a second metallic nitride layer formed at least partially between the first-level metal layer and the second-level layer; wherein at least a portion of said first-level metal layer is in direct contact with said Al layer.

16. The semiconductor device according to claim 15, further comprising a bump electrode formed on the multi-level layer.

17. The semiconductor device according to claim 16, wherein the bump electrode is made of a low-melting-point metal.

18. The semiconductor device according to claim 17, wherein the low-melting-point metal is one of a solder alloy containing Pb and Sn as main components, and a solder alloy containing Pb and Sn as main components and at least one additive metal selected from the group consisting of Ag, Pd, Sb and Bi.

19. The semiconductor device according to claim 15, wherein the first-level metal layer is made of Ti, the first metallic nitride layer is made of TiN, and the insulating layer is made of SixNy.

20. The semiconductor device according to claim 15, wherein the first-level metal layer is made of one selected from the group consisting of IV A-group, VI A-group and II B-group transition metals.

21. The semiconductor device according to claim 15, wherein the second-level layer is made of one selected from the group consisting of VIII A-group, I B-group and II B-group transition metals.

22. The semiconductor device according to claim 15, wherein the third-level layer is made of one selected from the group consisting of Pd, Au, Pt, Ag and their alloys.

* * * * *

UNITED STATES PATENT AND TRADEMARK OFFICE
CERTIFICATE OF CORRECTION

PATENT NO. : 5,648,686
DATED : July 15, 1997
INVENTOR(S) : Naohiko HIRANO et al.

It is certified that error appears in the above-indentified patent and that said Letters Patent is hereby corrected as shown below:

In Claim 2, Col. 6, line 67, after "multi-level", delete "metal".

In Claim 3, Col. 7, line 3, before "layer", delete "metal".

In Claim 12, Col. 7, line 59, before "metallic", insert --first--.

In Claim 12, Col. 7, line 60, "region" should read --layer--.

Signed and Sealed this

Fourth Day of November, 1997

Attest:

BRUCE LEHMAN

Attesting Officer     Commissioner of Patents and Trademarks